United States Patent [19]
Tanahashi

[11] Patent Number: 5,551,984
[45] Date of Patent: Sep. 3, 1996

[54] VERTICAL HEAT TREATMENT APPARATUS WITH A CIRCULATION GAS PASSAGE

[75] Inventor: Takashi Tanahashi, Sagamihara, Japan

[73] Assignees: Tokyo Electron Kabushiki Kaisha, Tokyo-To; Tokyo Electron Tohoku Kabushiki Kaisha, Iwate-Ken, both of Japan

[21] Appl. No.: 353,288

[22] Filed: Dec. 5, 1994

[30] Foreign Application Priority Data

Dec. 10, 1993 [JP] Japan .................................. 5-341425
Feb. 10, 1994 [JP] Japan .................................. 6-037889

[51] Int. Cl.$^6$ .............................................. C23C 16/00
[52] U.S. Cl. ..................... 118/724; 118/715; 118/719; 432/241; 414/939; 414/940; 414/156; 414/198
[58] Field of Search .................... 118/715, 724, 118/725, 719; 432/241; 55/213; 34/82; 414/939, 940, 150, 156, 160, 172, 194, 198, 217, 153

[56] References Cited

U.S. PATENT DOCUMENTS

| | | | |
|---|---|---|---|
| 4,612,174 | 11/1986 | Fabian | 423/210 |
| 4,894,071 | 1/1990 | Klein | 55/97 |
| 5,139,459 | 8/1992 | Takahashi | 454/187 |
| 5,181,819 | 1/1993 | Sakata et al. | 414/217 |
| 5,207,578 | 5/1993 | Sakata | 432/241 |
| 5,219,464 | 6/1993 | Yamaga et al. | 55/213 |
| 5,221,201 | 6/1993 | Yamaga | 432/241 |
| 5,226,812 | 7/1993 | Sakata | 432/241 |
| 5,254,170 | 10/1993 | Devilbiss | 118/719 |
| 5,261,167 | 11/1993 | Sakata | 34/82 |
| 5,261,935 | 11/1993 | Ishi et al. | 55/213 |
| 5,277,579 | 1/1994 | Takanabe | 432/5 |
| 5,303,671 | 4/1994 | Kondo | 118/719 |
| 5,320,733 | 6/1994 | Bohm | 204/408 |
| 5,328,360 | 7/1994 | Yokokawa | 432/250 |
| 5,336,325 | 8/1994 | Devilbiss | 118/719 |
| 5,378,283 | 1/1995 | Ushikawa | 118/719 |
| 5,388,944 | 2/1995 | Takanabe | 414/217 |
| 5,433,785 | 7/1995 | Saito | 118/719 |
| 5,459,943 | 10/1995 | Tanahashi | 34/82 |
| 5,462,397 | 10/1995 | Iwabuchi | 414/222 |
| 5,464,475 | 11/1995 | Sikes | 118/719 |

FOREIGN PATENT DOCUMENTS

| | | | |
|---|---|---|---|
| 196523 | 7/1992 | Japan | 118/724 |
| 269825 | 9/1992 | Japan | 118/724 |
| 269824 | 9/1992 | Japan | 118/724 |
| 306824 | 10/1992 | Japan | 118/724 |

OTHER PUBLICATIONS

Leonard, Milt, Expanded Teflon Filter Helps Build Denser Faster Disk Drives, Electronic Design, May 25, 1989 V. 37 No. 11 p. 30.

Primary Examiner—Robert Kunemund
Assistant Examiner—Jeffrie R. Lund
Attorney, Agent, or Firm—Beveridge, DeGrandi, Weilacher & Young, LLP

[57] ABSTRACT

A circulation duct with a blow fan and a shutter is provided to form gas flows in a transfer chamber below a heat treatment furnace, and a dust removing filter unit is provided in a blowout port of the circulation gas passage. Three, for example, gas supply pipes with a number of blowout holes are provided on the front side of the filter unit at set heights, and a clean air source is connected to the proximal end of the air supply pipes through an opening/closing valve. Clean gas is fed into the transfer chamber from the clean air source from the start of an unloading of the wafers to the time of the dismounting of the wafers from a wafer boat with the circulation of gas flows in the circulation gas passage stopped. A filter material of the dust removing filter is PTFE, which can reduce the amount of impurities scattered from the dust removing filter that attach on the wafers.

11 Claims, 10 Drawing Sheets

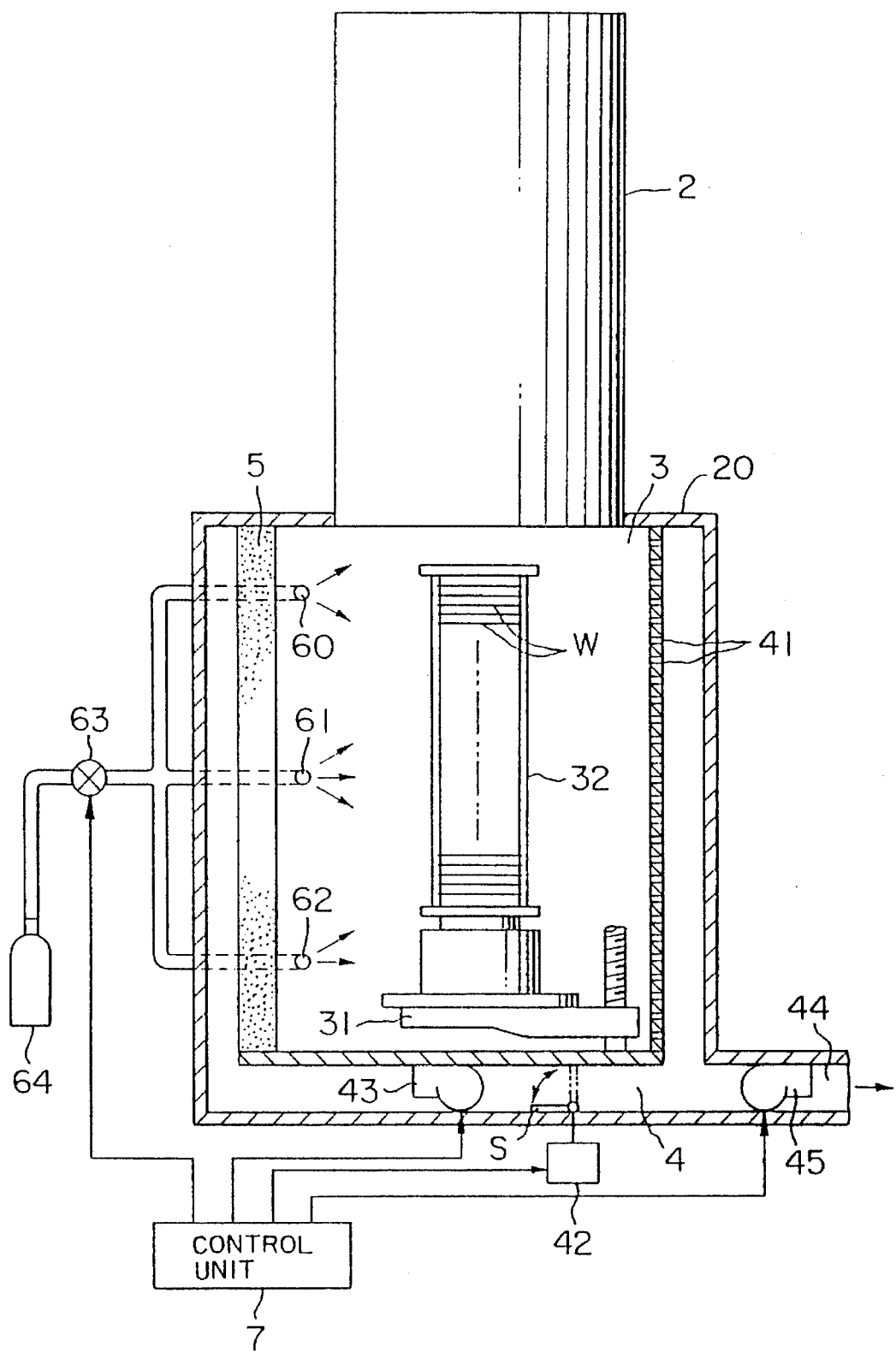
F I G. 1

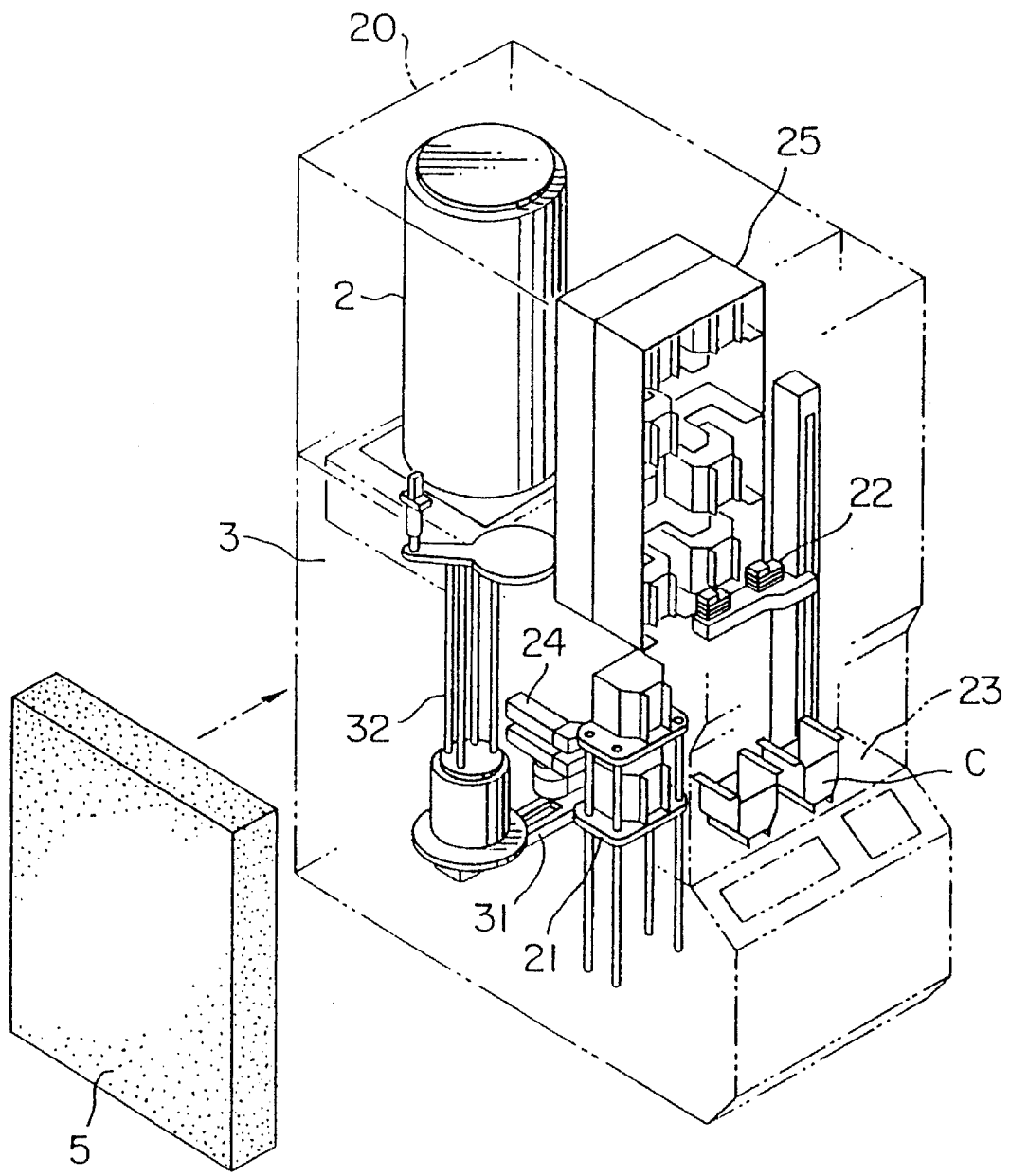
F I G. 2

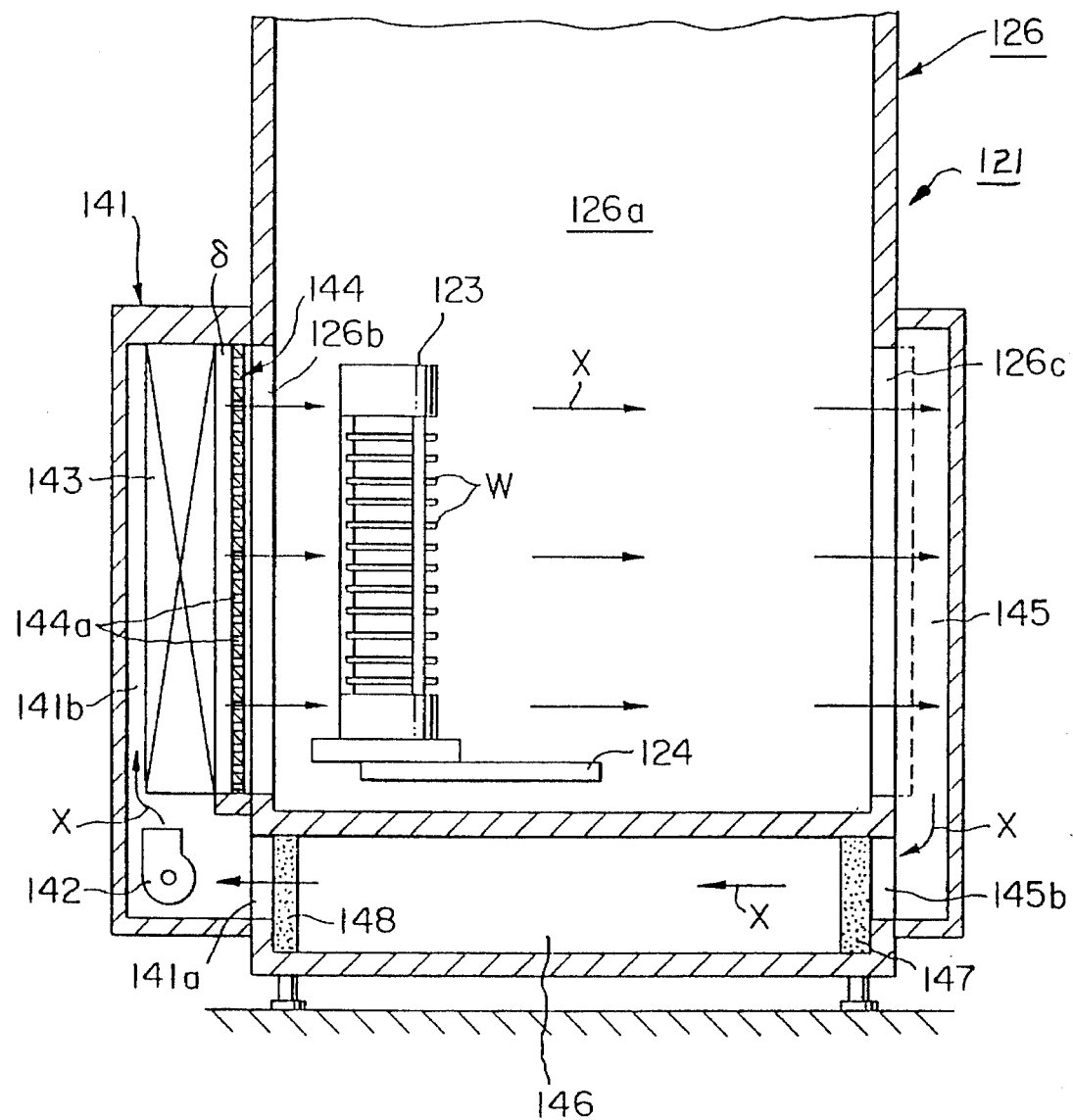
F I G. 14

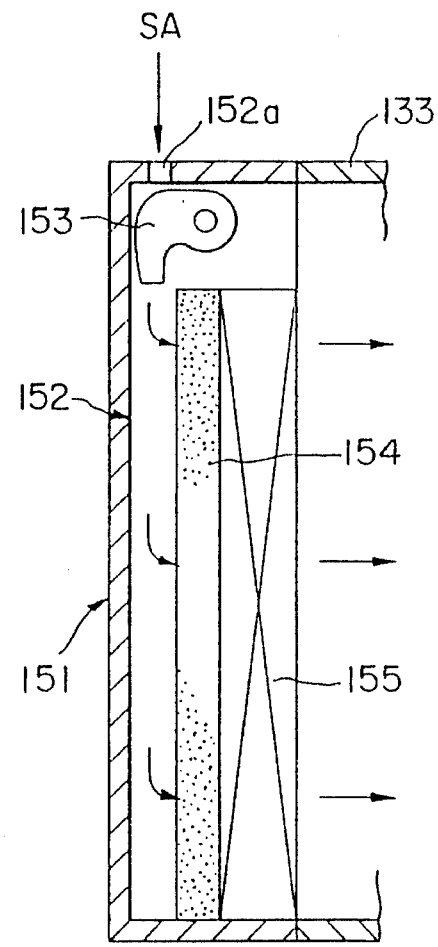 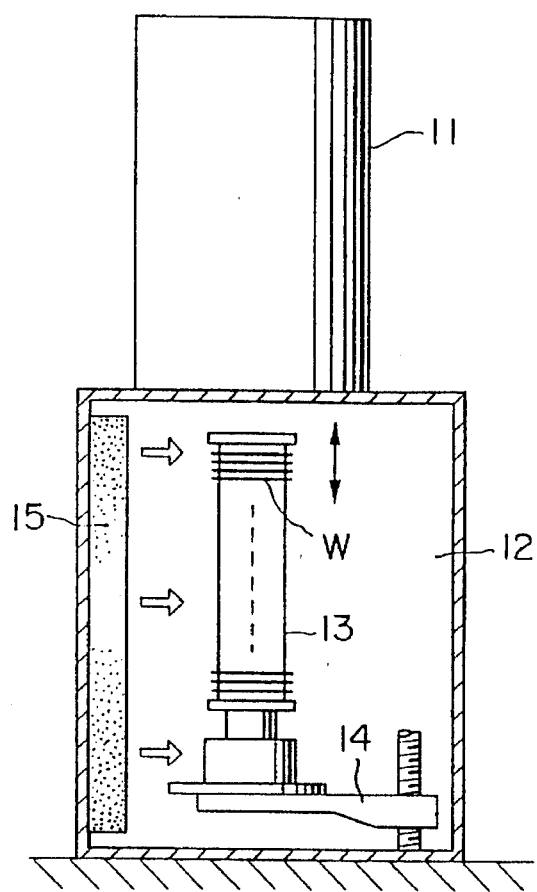
FIG. 15
FIG. 16
PRIOR ART

VERTICAL HEAT TREATMENT APPARATUS WITH A CIRCULATION GAS PASSAGE

BACKGROUND OF THE INVENTION present invention relates to a heat treatment apparatus. A semiconductor fabrication process includes heat treatment steps, such as film deposition, oxidation, diffusion etc. As a heat treatment apparatus which conducts these treatments there is used a vertical heat treatment apparatus which has the advantage of taking in little air during operation.

As shown in FIG. 16, this conventional heat treating apparatus includes a transfer chamber 12 which is an operation space formed below a vertical heat treatment furnace 11, and a wafer boat 13 which is vertically moved between the transfer chamber 12 and the heat treatment furnace by boat elevator 14. Semiconductor wafers W are mounted on the wafer boat 13 vertically spaced from each other to be carried on the wafer boat 13 into the heat treatment furnace 11 for a heat treatment there. After the heat treatment, the wafer boat 13 is loaded out of the heat treatment furnace 11 to dismount the wafers W from the wafer boat 13.

In this heat treatment apparatus, for preventing particles in the ambient atmosphere and particles generated when the wafers are transferred from sticking to the wafers W, air which has been cleaned through a dust removing filter unit 15 is supplied into the transfer chamber 12 from a circulating ventilation air flue (not shown).

The filter unit 15 comprises a filter material folded in a bellows which is secured to a frame at the top and bottom and at both sides by an adhesive or seal member. Since the wafers unloaded out of the heat treatment furnace have high temperatures, radiant heat from the wafers W heats the filter unit 15 up to high temperatures, and organic components, e.g., hydrocarbon, etc., are scattered from the adhesive, e.g., resin used in the filter unit 15. The organic components react with films deposited on the heated semiconductor wafers W to adversely deteriorate electric characteristics, film performance of the deposited film, etc., with a result of lower yields of the wafers. This is much affective to micronization of wafers for above 16 MDRM.

Filter materials for the filter unit 15 contain impurities, such as boron (B), etc., and when the filter materials are exposed to high temperatures or air having an acid atmosphere, boron, etc. scatter in larger amounts. As patterns of devices are more micronized, the impurities from the filter materials much affect yields of the wafers.

The filters of filter units are commonly provided by ULPA (Ultra Low Penetration Air) filters. Conventionally ULPA filter of this kind are made of borosilicate glass fiber as a filter material, which is based on $SiO_2$, $B_2O_3$, etc.

Recently wafers have been manufactured with larger diameters and, in addition, micronized, deposited film layers, as of silicon oxide films, silicon nitride film, etc., formed by heat treatments, have become thinner. Property control of the deposited film layers, e.g., for electric characteristics are becoming more severe. Qualities of the deposited film layers are much affected by traces of impurities in the ambient atmosphere.

In this connection, it has been found that since the filter material of the conventional ULPA filters is borosilicate glass fiber based on $SiO_2$, $B_2O_3$, etc., when the filter material itself is exposed to bad conditions, such as exposure to acid components used in wafer washing and quartz washing and to radiant heat from the wafer boat and reaction tube immediately after a heat treatment, boron (B) is generated. Consequently there has been a risk that the boron (8) may mix into clean air which has passed the filter material.

The filter material of this kind is generally folded in the bellows of an accordion which is secured to a suitable frame. Adhesives and spacers for securing the filter material are made from resins containing volatile solvents. There is a risk that in the above-mentioned acid atmosphere or high-temperature atmosphere, organic gas may be generated from these adhesives and spacers themselves and contaminate the clean air which has passed through the filter.

Thus the conventional heat treatment apparatus has a risk that boron and organic components generated from the filter itself stay on the surfaces of wafers and contaminate the wafers, with a result of low yields.

SUMMARY OF THE INVENTION

The present invention was made in view of the above-described problems. An object of the present invention is to provide a heat treatment apparatus which can reduce the amount of impurities that attach to objects to be treated in the transfer chamber.

The heat treatment apparatus according to a first embodiment of the present invention in which objects to be treated on an objects-to-be-treated holder are loaded from a transfer chamber into a reaction vessel, and unloaded therefrom, and gas in the transfer chamber is ventilated through a circulation passage having a drawing port and a blowout port opened in the transfer chamber. The heat treatment apparatus further includes dust removing filter units, a clean gas source, a supply passage for supplying clean gas from the clean gas source into the transfer chamber without passing the clean gas through the dust removing filter units, an opening/closing valve provided in the supply passage, and a control unit for selecting a first mode or a second mode. The first mode involves opening the opening/closing valve and stopping ventilation through the circulation gas passage, the second involves closing the opening/closing valve and effecting ventilation through the circulation gas passage.

In the first embodiment, gas circulation is stopped through the circulation gas passage from, e.g., the unloading of the treated objects to the loading of the objects to be next treated, and clean gas is fed in the transfer chamber without passing through the dust removing filter units to form gas flows. While the objects to be treated are in the reaction tube, the gas is circulated between the circulation gas passage and the transfer chamber to form gas flows of the gas from the dust removing filters, whereby particles in the transfer chamber are removed. Accordingly even when the dust removing filter units are exposed to radiant heat from the heat-treated objects, the amount of organic components from the filter units that attach to the objects to be treated can be much suppressed.

To achieve the object of the present invention, the present invention uses, as a filter material of the filter units of the heat treatment apparatus and a resin supporting the filter material, materials which generate no boron and organic components.

To achieve the object of the present invention, the heat treatment apparatus according to the present invention comprises a heat treatment furnace for heating objects to be treated to make a required heat treatment, a casing for housing a heat treatment furnace, blowing means for forming air flows in the casing, and a filter unit for cleaning the air flows and establishing clean environments for the apparatus, a material of the filter unit being PTFE (polytetrafluoroethylene).

In the filter unit involved in the present invention whose material is PTFE, no boron and organic components are generated from the filter material itself when the air flows in the casing of the heat treatment apparatus. There is no risk that organic impurities may be generated from the filter unit itself to contaminate objects-to-be-treated in the casing.

BRIEF DESCRIPTION OF THE DRAWINGS

FIG. 1 is a vertical sectional view of the heat treatment apparatus according to a first embodiment of the present invention.

FIG. 2 is a perspective view of the general structure of the heat treatment apparatus of FIG. 1.

FIG. 14 is a partial vertical sectional view of the structure of the lower space of the interior of the casing of the heat treatment apparatus according to the second embodiment of the present invention.

FIG. 15 is a partial vertical sectional view of the structure of the second blowing means of the heat treatment apparatus according to the second embodiment of the present invention.

FIG. 16 is a diagrammatic view of the conventional heat treatment apparatus.

DETAILED DESCRIPTION OF PREFERRED EMBODIMENTS

Figure 3:
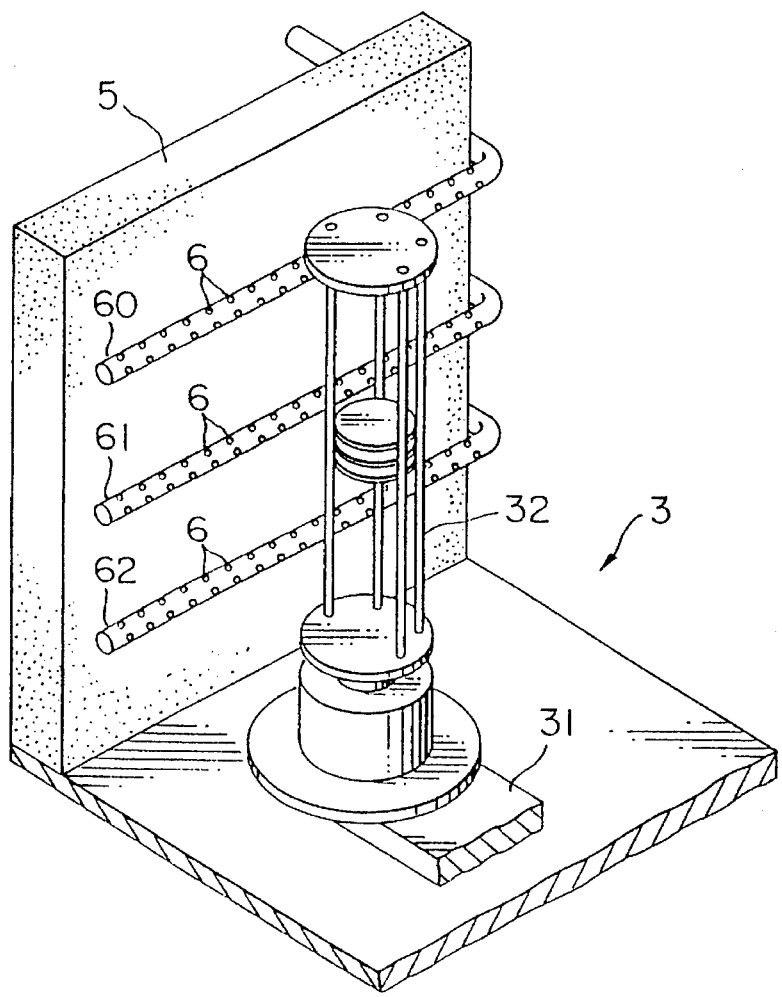
FIG. 3 is a perspective of a major part of the heat treatment apparatus FIG. 1.

FIG. 1 is a vertical sectional side view of the vertical heat treatment apparatus according to a first embodiment of the present invention. FIG. 2 is a perspective view of the general structure of the vertical heat treatment apparatus of FIG. 1. In FIGS. 1 and 2, reference numeral 2 indicates a vertical heat treatment apparatus. The interior of the vertical heat treatment apparatus 2 is not shown but includes a reaction tube, a heater provided around the reaction tube, etc. A transfer chamber 3, an operational space, is formed below the heat treatment furnace 2, and the heat treatment furnace 2 and the transfer chamber 3 are surrounded by a casing 20.

A boat elevator 31 which is a lift mechanism for a wafer boat 32 is provided in the transfer chamber 3. A wafer boat for holding objects to be treated (wafers) is provided on the boat elevator 31. The wafer boat 32 holds wafers W vertically spaced from each other and is loaded into and unloaded out of the reaction tube of the heat treatment furnace.

As shown in FIG. 2, on the front side of the transfer chamber 3, a wafer carrier (hereinafter called "carrier") mount 21 where wafers are delivered/received is provided. A carrier entry/exit port 23 is provided on the front side of the carrier mount 21 through a transfer territory of a carrier transfer mechanism 22. The wafer transfer mechanism 22 is provided between the carrier mount 21 and the boat elevator 31, and a carrier stocker 24 is disposed above the carrier mount 21. Ventilation holes through which air is, respectively, drawn and blown out are formed in both side walls of the transfer chamber 3. An air flow restricting plate e.g., a metal plate with a number of fine holes 41, is provided in the ventilation hole on the air drawing side.

As shown in FIG. 1, a circulation passage 4 as a circulation air flue is formed on both sides and the underside of the transfer chamber 3. In the circulation passage 4, e.g., below the transfer chamber 3, a shutter S which is opened/closed by an opening/closing mechanism 42 to open/close the circulation passage 4 and blowing means, e.g., a first blowing fan 43, are provided, and a dust removing filter unit S in the form of, e.g., a bellows of a filter material, is provided in the blowout port of the duct 4.

An exhaust duct 44 is branched from the circulation passage 4 upstream of the first blowing fan 43 and is connected on the discharge side to a factory exhaust duct. A second blowing fan 45 is disposed in the exhaust duct 44.

As shown in FIGS. 1 and 3, air feed pipes 60, 61, 62 are provided on an upper end part, the middle part and a lower end part of the front side of the dust removing filter unit 5 horizontally widthwise of the dust removing filter unit S. A number of air blowout holes 6 are formed lengthwise in the sides of the respective air feed pipes opposed to the wafer boat 32. In this embodiment the air feed pipes 60–62 are feed pipes for clean air and, as shown in FIG. 1, are connected to a common clean air source 64, e.g., a clean air bomb.

In the first embodiment, as shown in FIG. 1, there is further provided a control unit 7 which controls the switching of modes of ventilation for the transfer chamber 3. The control unit 7 controls the opening/closing mechanism 42 for the shutter S, the first blowing fan 43, the second blowing fan 45 and an opening/closing valve 63 for switching, at a set timing, between a first mode of circulating clean air from the clean air source 64 into the transfer chamber 3 and discharging the air through the exhaust duct 44, and a second mode of circulating air in the transfer chamber 3 through the circulation passage 4.

Next the operation of the first embodiment will be explained. Carrier or cassette C holding 25 sheets of objects to be treated, e.g., wafers, is placed on the carrier entry/exit port 23 by convey means (not shown), and the carrier C is transferred onto the carrier mount 21 by the carrier transfer mechanism 22. Then, in the transfer chamber 3, the wafers W are transferred from the carrier C on the carrier mount 21 to the wafer boat 32. The wafer boat 32 can hold, e.g., 100 sheets of wafers W vertically spaced from each other.

Then the boat elevator 31 is lifted to load the wafer boat 32 from the transfer chamber 3 into the heat treatment furnace 2. The heat treatment furnace 2, which has been preheated up to, e.g., about 800° C., is further heated up to a required temperature, e g., above 1000° C., after the wafers W have been loaded, and a heat treatment, e.g, oxidation, is conducted. After a required period of time, the boat elevator 31 is lowered to unload the wafer boat 32 into the transfer chamber 3, and the transfer mechanism 22 takes out the wafers W from the wafer boat 32 to transfer them into the carrier C on the carrier mount 21.

Figure 4:
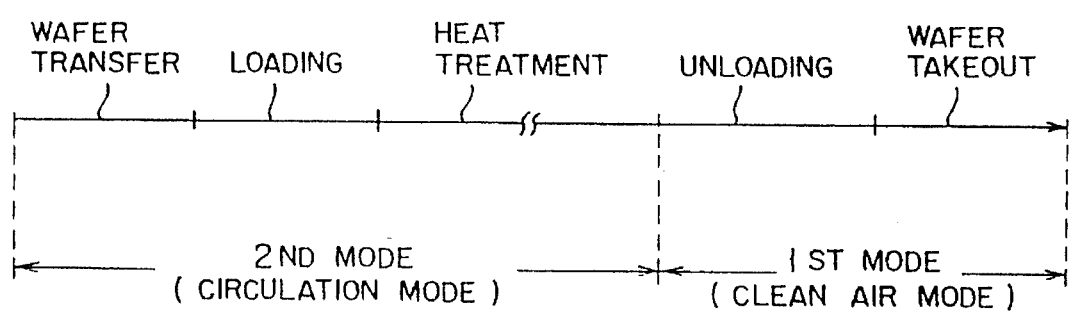
FIG. 4 is a view explaining relationships between the treatment steps of the heat treatment apparatus according to the first embodiment and gas flow forming modes.

Then the ventilation modes of air in the transfer chamber 3 will be explained referring to FIG.4 and corresponding to the above-described steps. The control unit 7 selects the second mode, i.e., the air circulation mode in the step of transferring the wafers onto the wafer boat 32, the step of loading the wafers and the step of a heat treatment. In the second mode, with the first blowing fan 43 on, second blowing fan 45 off, the opening/closing valve 63 closed and the shutter S opened, air in the transfer chamber 3 is drawn from the air flow restriction plate 41 into a part of the circulation passage 4 on the right side of the transfer chamber 3 as viewed in FIG. 1 and is circulated into a part of the circulation passage 4 on the left side of the transfer chamber 3 as viewed in FIG. 1 through a part of the circulation passage 4 below the transfer chamber 3. Then the air passes through the dust removing filter unit 5, so as to have particles removed, and is fed into the transfer chamber 3. Air is thus circulated, forming air flows in the transfer chamber 3, whereby the attachment of particles on the wafers W is prevented.

When a heat treatment is over, and the wafer boat 32 starts to be unloaded, the control unit 7 selects from this time to the end of dismount of the wafers W from the wafer boat 32 the first mode, i.e., the clean air supply mode. In the first mode, with the first blowing fan 43 off, the second blowing fan 45 on, the opening/closing valve 63 open and the shutter S closed, clean air from the clean air source 64 is sent to the air feed pipes 60–62 and is fed into the transfer chamber 3 through the blowout holes 6 by, e.g., 200 l/minute. The air enters a space (a part of the circulation passage 4) behind the air flow restricting plate 41 through the same 41 and is exhausted through the exhaust duct 44 by the second blowing fan 45.

Thus according to the first embodiment, clean air is fed from the clean air source 64 into the transfer chamber 3 without being passed through the dust removing filter unit 5 with air flow through the circulation passage 4 stopped, whereby even when wafers W are unloaded, and the dust removing filter unit 5 is heated up to considerably high temperatures by radiant heat from the unloaded high temperature wafers W, scattering of impurities, such as boron from the filter material of the dust removing filter unit 5 and organic components from the adhesive into the transfer chamber 3 can be prevented while particles generated in the transfer chamber can be discharged. Consequently attachment of particles and impurities to the wafers W can be prevented. Then, after the wafers W have been dismounted from the wafer boat 32, air is circulated through the circulation. Thus the clean air source 64 is actuated only when necessary, which can reduce costs. The air circulation modes may be selected when wafers W are transferred or loaded other than in the above-described steps.

Figure 5:
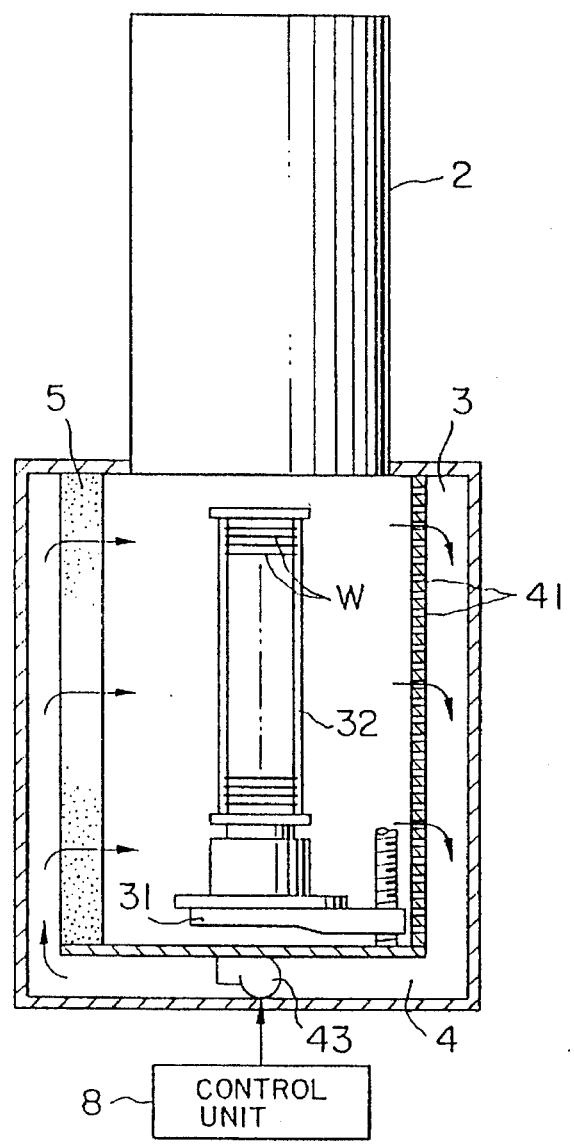
FIG. 5 is a vertical sectional view of a modification of the heat treatment apparatus according to the first embodiment of FIG. 1.
Figure 6:
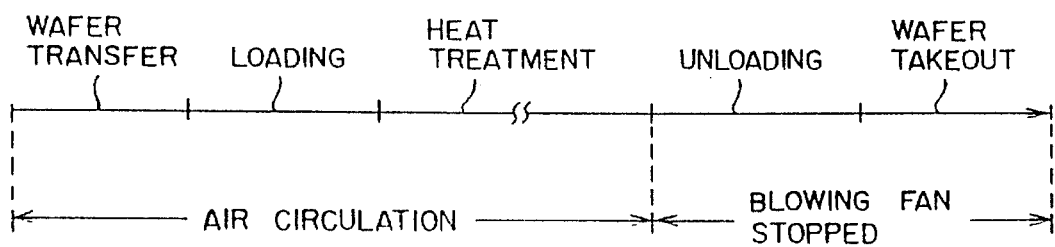
FIG. 6 is a view explaining relationships between the treatment steps of the heat treatment apparatus according to the first embodiment and gas flow forming modes.

In the present invention, it is not essential to feed clean air from the clean air source when air circulation in the transfer chamber 3 is stopped. FIGS. 5 and 6 show an embodiment of such a case. In this embodiment, a control unit 8 turns on the blowing fan 43 during the steps of transferring wafers onto the wafer boat 32, loading the wafer boat 32 and conducting a heat treatment, and during the steps of unloading the wafer boat 32 and dismounting the wafers from the wafer boat 32 the blowing fan 43 is turned off. In this embodiment, even when the dust removing filter unit 5 is heated by radiant heat of the wafers W, no air flows through the dust removing filter unit 5, and accordingly contamination from scattering boron and organic components from the dust removing filter 5a can be depressed. The wafers W are thus less likely to be made defective.

In the first embodiment, in the case that clean air is caused to flow in the transfer chamber 3 in the clean air mode (the first mode), air feed pipes (not shown) may be provided, e.g., on the back of the apparatus depicted in of FIG. 2.

The gas streams in the transfer chamber 3 are not limited to air flows, and, for example, it is possible that the transfer chamber 3 is in the form of a load-lock chamber, and the gas streams are nitrogen gas streams. The heat treatment apparatus according to the first embodiment is applicable to not only oxidation, but also to batch heat treatments, such as diffusion, CVD, etching, etc.

Thus in the heat treatment apparatus according to the present invention in which gas streams are formed in the transfer chamber through the circulation passage with the dust removing filter, ventilation through the circulation passage is stopped as required, and instead clean gas is fed from the clean gas source without being passed through the dust removing filter, or ventilation through the circulation passage is stopped as required without feed of the clean gas. Accordingly even when the dust removing filter is heated by radiant heat from treated objects, degradation of the wafers due to impurities scattered from the dust removing filter can be suppressed.

Figure 7:
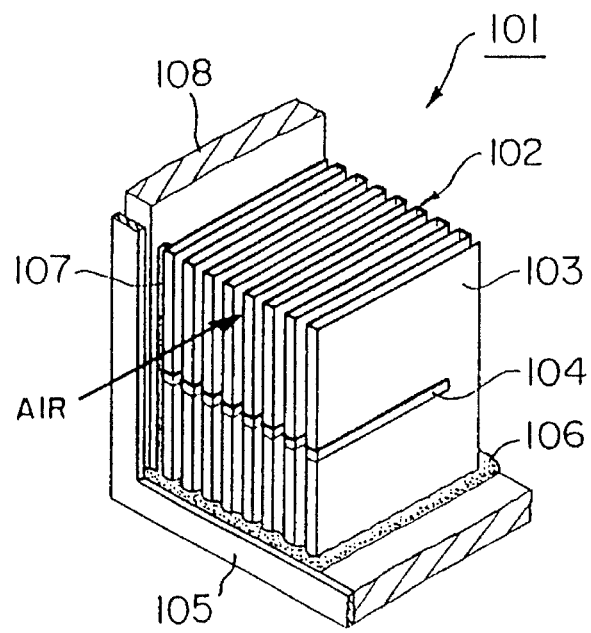
FIG. 7 is a partially broken perspective view of a filter unit used in the heat treatment apparatus according to a second embodiment of the present invention.

Next, a second embodiment of the present invention will be explained with reference to FIG. 7. FIG. 7 shows a filter unit 101 used in the second embodiment.

Figure 8:
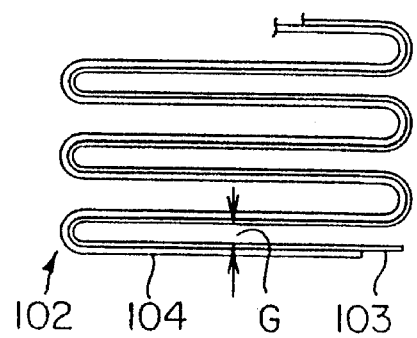
FIG. 8 is a partial enlarged top view of a filter of the filter unit of FIG. 7.

The filter unit 101 has the same structure as the conventional generally used ULPA filters. A filter 102 of the filter unit 101 has pleats (bellows) of a filter material 103. The filter material 103 is an unwoven fabric of PTFE (polytetrafluoroethylene) or an olefin-based fiber, and has a 0.05–0.22 µm fiber diameter and a 0.3 µm bore. The pleats of the filter material 103 is set by a spacer 104 in the form of a plastic band adhered to a side of the filter material 103 (FIG. 8).

The spacer 104 is made of high molecular dimer acid polyamide resin. The molten resin is adhered to a side of the filter material 103 when the filter material 103 is pleated, and then cool-set, whereby a gap G of, e.g., about 5 mm is formed between respective pleats of the filter material 103.

The filter 102 (e.g., 600 cm-square) is secured to an aluminium frame 105. The filter 102 is fixed at the ends by an end seal material 106 of epoxy resin and at the sides by a side seal material 107 of a chloroprene-based adhesive. Gaskets 108 are formed of chloroprene sponge and support the ends of the filter material 103.

Figure 9:
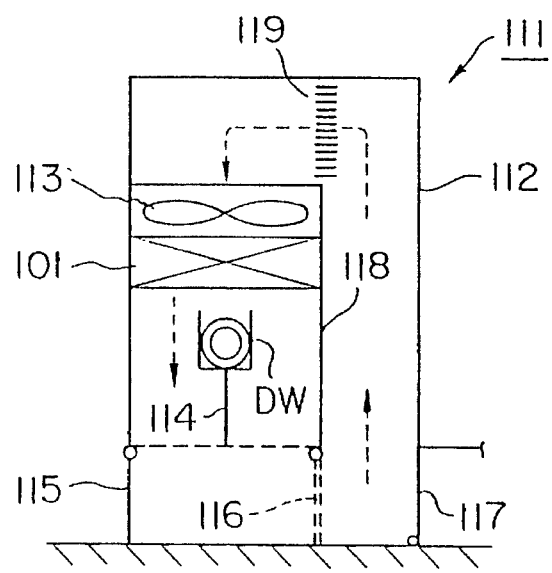
FIG. 9 is a diagrammatical vertical sectional view of the heat treatment apparatus according to the second embodiment.

This filter unit 101 is provided in a test heat treatment apparatus 111 whose front view is shown in FIG. 9. This test heat treatment apparatus 111 includes a blower 113, a wafer holder 114 to be exposed to downflows caused by the blower 113 in a stainless steel casing 112, and further a first damper 115, a second damper 116 and a third damper 117 lower in the casing 112. In the state of FIG. 9, the first and the third dampers 115, 117 are closed, and the second damper 116 is opened, whereby a circulation flow as shown is formed in the casing 112. That is, the downflow caused by the blower 113 flows through an area isolated from a space (reaction space) with the wafer holder 114 provided in by a partition plate 118 and into an upper part of the casing 112, and then passes through a heater 119 and is again formed into a downflow by the blower 113. The filter unit 101 of FIG. 7 is provided between the blower 113 and the wafer holder 114 to clean the flow from the blower 113. The test heat treatment apparatus has this structure.

Then the test treatment apparatus with a dummy wafer DW set on the wafer holder 114 was actually operated. Contamination of the dummy wafer DW will be explained.

The dummy wafer DW had a 1000 Å-thickness $SiO_2$ film formed on a silicon wafer by wet oxidation. Following this film deposition, the dummy wafer DW was cleaned for 10 minutes by the so-called SPM (Sulfuric acid Hydrogen Peroxide Mix), i.e., the dummy wafer DW was cleaned for 10 minutes with a cleaning liquid of 110° C. which was a mixture of sulphuric acid ($H2SO4$) and hydrogen peroxide ($H2O2$) by 4:1, then further cleaned for 102 minutes with pure water, and then dried by a spin drier.

On the other hand, the heat treatment apparatus was idled continuously for 6 weeks in the state for forming the so-called one-way flow in the casing 112 with the second damper 116 closed, and the first and the third dampers 115, 117 open.

Figure 10:
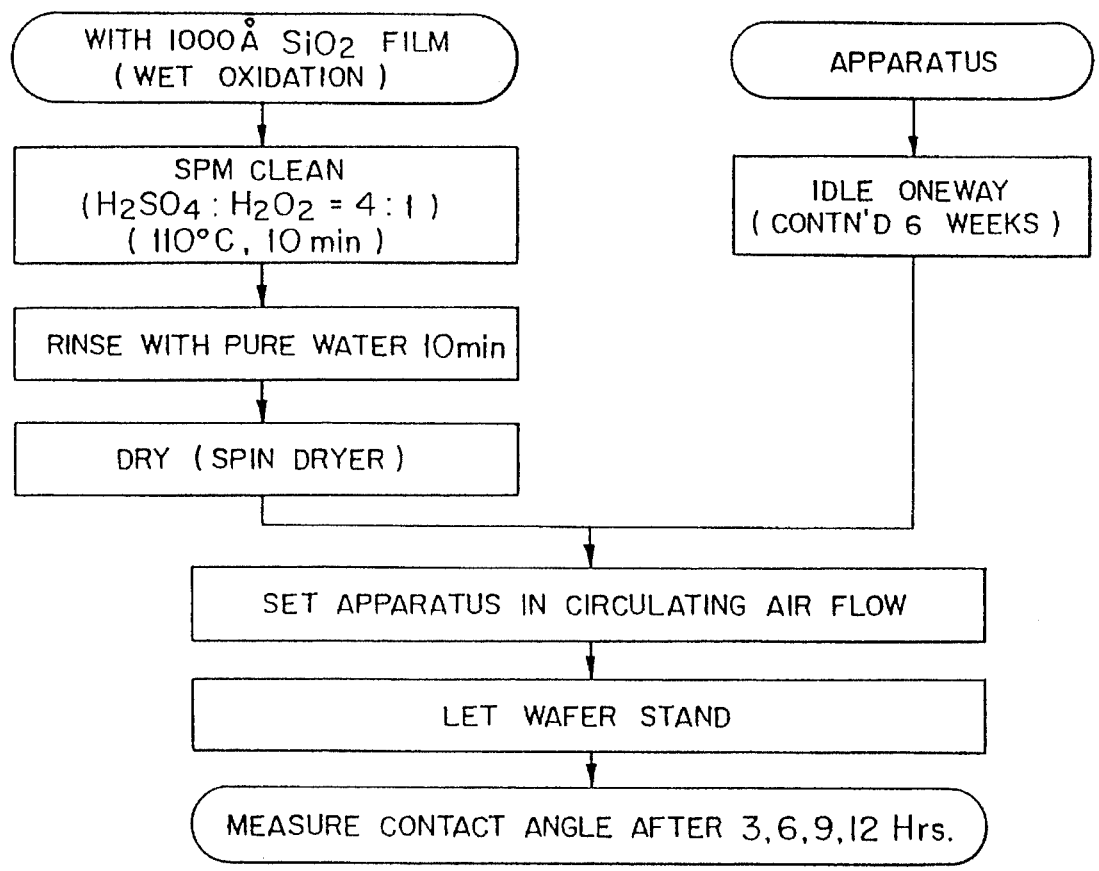
FIG. 10 is a flow chart of the procedure of a method for evaluating the effect of the heat treatment apparatus according to the second embodiment.

The dummy wafer DW was set on the wafer holder 114, and as shown in FIG. 9 the first and the third dampers 115, 117 are closed, the second damper 116 is opened so that circulating flows was formed in the casing 112. The dummy wafer DW was left in this state, and contamination of the wafer surface was measured by the so-called contact angle gauging method respectively after 3, 6, 9 and 12 hours. This test procedure is shown in the flow chart of FIG. 10.

In the so-called contact angle gauging method, pure water was dropped on the surface of the dummy wafer, and a contact angle between the drop under a surface tension and the wafer surface was gauged. Contamination of the wafer surface was evaluated by using the fact that higher contamination by organic impurities increase contact angles.

As to the other conditions, a heater 119 in FIG. 9 was heated up to a circulation temperature of 40° C., a flow rate through the filter unit 101 was 0.35 m/sec, and a distance between the filter unit 101 and the dummy wafer DW was 50 mm.

For comparison with the conventional ULPA filter, the filter unit 101 having the filter 105 made of the above mentioned filter material 103 of borosilicate glass fiber based on $SiO_2$, $B_2O_3$, etc. was additionally prepared. The contamination was evaluated under the same conditions by the contact angle gauging method.

Figure 11:
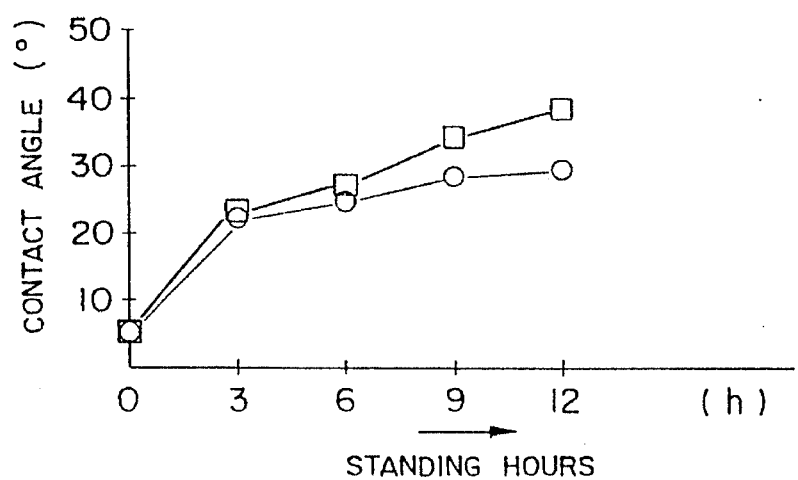
FIG. 11 is a graph comparing contamination of wafers treated by the heat treatment apparatus according to the second embodiment with that of wafers treated by the use of the conventional ULPA filter.

The results are shown in the graph of FIG. 11. After being left for 3 hours, no conspicuous difference was found between the two. But it was found that, when left for longer periods of time, the dummy wafer DW in the case of the ULPA filter had increased contact angles which increased with time. In the case of the filter unit 101 involved in the second embodiment, the contact angles were substantially the same. That is, it was confirmed that in the second embodiment, even when the dummy substrate W was exposed to the downflow for a long time under the above-described conditions, contamination of the surface of the dummy wafer DW was low.

This heat treatment apparatus 111 is fabricated for test use but can produce substantially the same environments as the general heat treatment apparatuses. Even in a case that the filter unit 101 is applied to the general heat treatment apparatuses, the corresponding effect, i.e., no organic impurities are generated from the filter unit, and accordingly a suppression of the contamination of the wafer surfaces can be easily assured.

Figure 12:
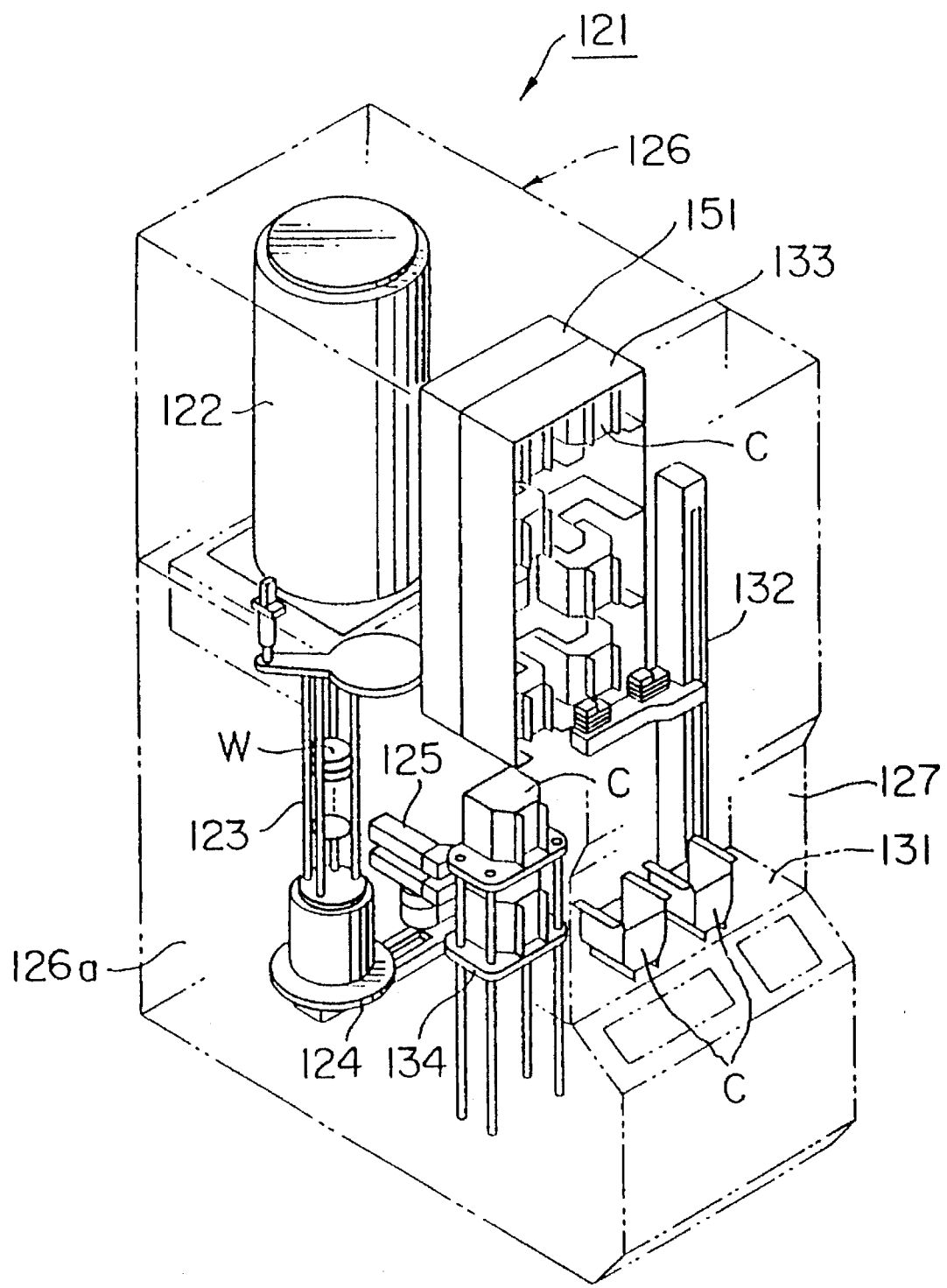
FIG. 12 is a perspective view of the appearance of the heat treatment apparatus according to the second embodiment of the present invention.
Figure 13:
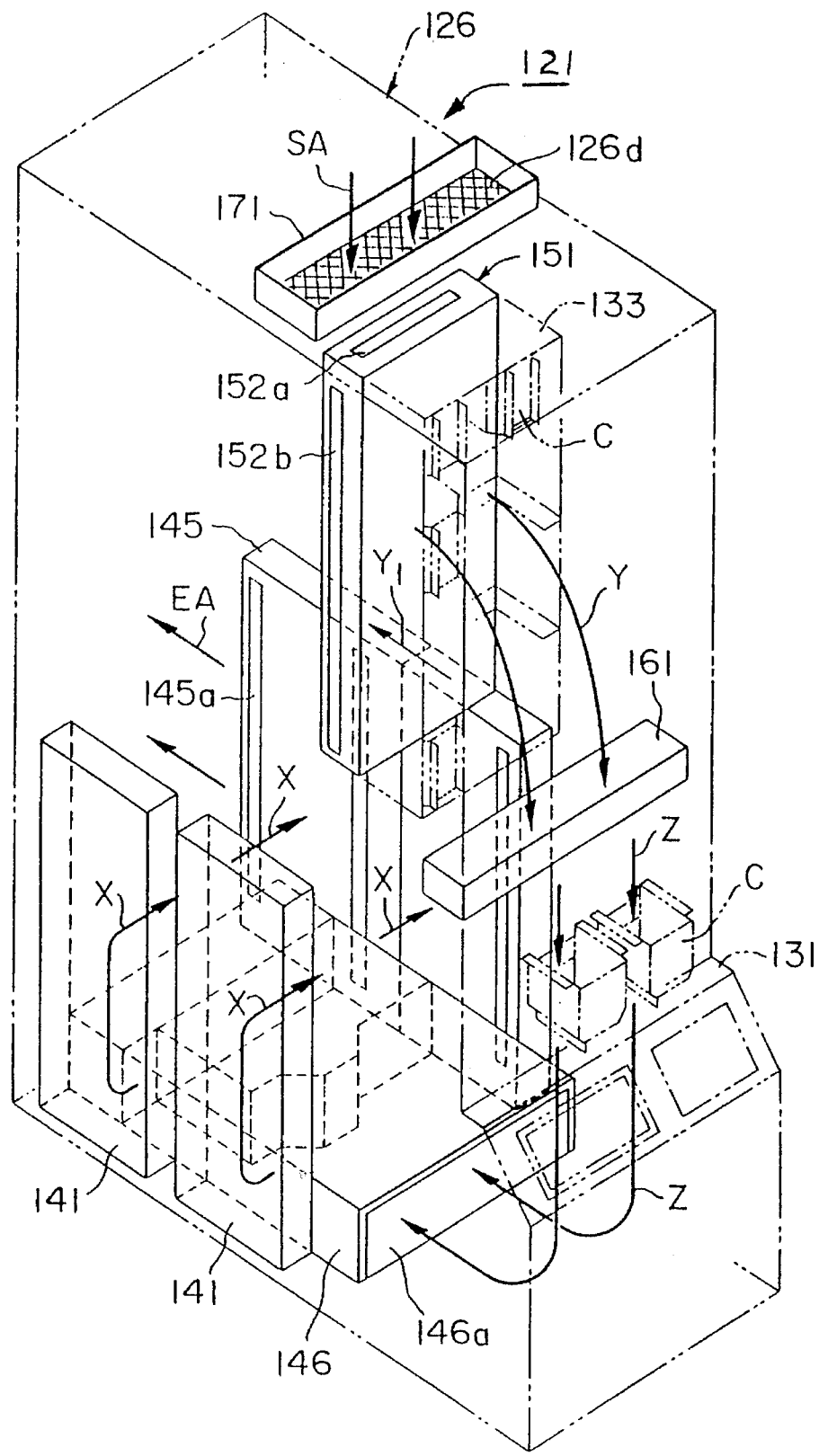
FIG. 13 is a view explaining direction of air flows in the casing of the heat treatment apparatus according to the second embodiment of the present invention.

Now a more specific heat treatment apparatus for practical use according to an embodiment will be explained. As shown in FIGS. 12 and 13, the heat treatment apparatus 121 according to the present embodiment includes a cylindrical heat treatment vessel (furnace) 122 having the upper end closed and the lower end opened, and lift means 124 which is disposed below the heat treatment vessel 122 to support and move a wafer boat 123 into and out of the heat treatment vessel 122.

The wafer boat 123 horizontally holds 100 sheets of wafers W, objects to be treated, vertically spaced from each other. The wafer boat 123 is loaded into and unloaded out of the heat treatment vessel 122 on the lift means 124.

The heat treatment apparatus 121 includes transfer means, e.g., wafer transfer means 125 for transferring the wafers W between cassettes C holding wafers W, and the wafer boat 123. The heat treatment vessel 122, the wafer boat 123 and the lift means 124 are provided in a casing 126.

The casing 126 has an opening 127 in the front side which is opened and closed by a door (not shown). The cassettes C are conveyed into and out of the casing through the opening 127.

Inside the opening 127, an I/O port 131 on which two cassettes C are placed is provided. At the r/O port 131, as will be explained later, air flows which flow downward from above are formed in the casing. The I/O port 131 includes alignment means (not shown) for aligning orientation flats of the wafers W in the cassettes C, and horizontal-vertical repositioning means (not shown) for turning the cassettes C by 90° to reposition the wafers W from a horizontal state to a vertical state. After the wafers W in the cassettes C are aligned at the orientation flats, the cassettes holding the wafers W are repositioned so as to be horizontal.

A carrier transfer means 132 is provided inwardly of the I/O port 131 so that the cassettes C are transferred onto carrier stage 133 arranged in shelves positioned inwardly of the carrier transfer means 132. The carrier stage 133 can hold, e.g., 8 cassettes C which store wafers W to be treated and treated wafers W.

A transfer stage 134 is provided below the carrier stage 133. The cassettes C are transferred between the carrier stage 133 and the transfer stage 134 through the carrier transfer means 132. A wafer transfer means 125 transfers wafers W between the cassettes C on the transfer stage 134 and the wafer boat 123 on the lift means 124.

As shown in FIGS. 13 and 14, the heat treatment apparatus 121 has first blowing means 141 and also a single door for maintenance formed in one side of a treatment space 126a in the casing 126, i.e., in an opening 126b in the left side thereof.

As shown in FIG. 14, the first blowing means 141 includes a fan 142 which is disposed below an opening 141a and draws air through the opening 141a and blows the air, a first filter unit 143 which removes particles, etc. in the air fed by the fan 142 into the casing 126 through a duct 141b, and an equalizing plate 144 provided inwardly of the first filter unit 143 with a gap δ parallel therewith. The first filter unit 143 has quite the same structure as the filter unit 101 of FIG. 7 and uses as the filter material an unwoven fabric of PTFE or an olefin based fiber.

The equalizing plate 144 has a number of blowout holes 144a. Supplied air which has passed the first filter unit 143 is uniformly blown from the entire surface of the equalizing plate 144 to a side duct 145 in a side opening 126c opposed to the equalizing plate 144.

The side duct 145 is in communication with an opening 145b formed therebelow through a bottom duct 146 provided on the bottom of the casing 126. As shown in FIG. 14, air blown by the first blowing means 141 is circulated in the sequence of through space 126a, through opening 126c of the side duct 145, through the bottom duct 146 the first blowing means 141 to form a circulating air flows X, and the circulating flows X is cleaned by the first filter unit 143 while flowing in the sequence. The bottom duct 146 accommodates control means for driving the lift means 124, the wafer transfer means 125, etc., and its lines, etc.

Active carbon filters 147, 148 are provided respectively in the entrance of the bottom duct 145 and the exit thereof, i.e., on the inside of an opening 145b and that of an opening 141a. The active carbon filters 147, 148 are in the form of, e.g., gas permeable mats of active carbon, or sheets of active carbon with a number of distributed fine holes, and function as the so-called prefilter for the first filter unit 143.

A slit 145a is formed in the side behind the side duct 145 for passing air from the first blowing means 141. A part of the circulating air flows X is exhausted as exhaust EA outside the casing 126 through the slit 145a as shown in FIG. 13. On the other hand, through an air inlet 126d of mesh metal formed in the ceiling of the casing 126, air supply SA in an amount corresponding to the exhaust EA is taken into the casing 126 from a clean room chamber (not shown). Thus, a constant internal pressure is always retained in the casing 126, and part of the air in the casing 126 is constantly ventilated by the exhaust EA and the air supply SA. An active carbon filter 171 is provided also in the air inlet 126d as shown in FIG. 13, so that the air supply SA to be introduced through the air inlet 126d can have organic impurities removed before supplied.

As shown in FIG. 13, second blowing means 151 is provided along the back side of the carrier stage 133 and below the air inlet 126d.

As shown in FIG. 15, the second blowing means 151 includes a vessel 152 with a slit 152a opposed to the air inlet 126d, a fan 153 which takes in air from the clean room through the slit 152a and the air inlet 126d and blows the air to the carrier stage 133, an active carbon filter 154 for cleaning the blown air, and second filter unit 155. The second filter unit 155 uses as the filter material unwoven fabric of PTF and olefine-based fiber as does the first filter unit 143. The air which has passed the second filter means 155 clean is blown onto the wafers W in the cassettes C on the carrier stage 133 to form air flows Y in FIG.13.

As shown in FIG. 13, slits 152b are formed respectively in both sides of the vessel 152 of the second blowing means 151. The slits 152b draw air flows Y1 which have impinged on the front of the casing 126 and returned and send the air to the active carbon filter 154 and the second filter unit 155 for again cleaning the air.

A third blowing means 161 is provided downstream of the air flows Y and above the I/O port 131. Most of the air flows Y is drawn by the third blowing means 161 and blown in descending air flows Z. The third blowing means 161 has basically the same structure as the second blowing means 151, and has an active carbon filter at the upstream and, on a lower stage, a filter unit using as the filter material an unwoven fabric of PTFE or an olefin-based fiber.

The descending air flows Z from the third blowing means 161 flow into the bottom duct 146 through the opening 146a in a side of the bottom duct 146 of the I/O port 131 to join the circulating air flows from the side duct 145.

The operation of the heat treatment apparatus 121 according to the present embodiment will be explained. First the heat treatment vessel 122 is heated up to a required temperature in accordance with a treatment to be made on objects to be treated, wafers W. Simultaneously therewith, the first blowing means 141, the second blowing means 151 and the third blowing means 161 are actuated to form the circulating air flows X, the air flows Y and the descending air flows Z in the casing 126 as in FIG. 13.

Then when two carrier cassettes C holding wafers W to be treated are placed on the I/O port 131 at a set position as shown in FIG. 12 by, e.g., a conveyor robot (not shown), the wafers W are aligned with respect to the orientation flats by the orientation flat aligner, and then the wafers W are repositioned to be horizontal by the horizontal-vertical repositioning mechanism. Then the cassettes C are transferred onto a set position on the carrier stage 133 by the carrier transfer means 132. This operation is repeated to store 8, for example, cassettes C on the carrier stage 133, and the opening 127 is closed.

Next, the cassettes C on the carrier stage 133 are transferred onto the transfer stage 134 by the carrier transfer means 132. Then, the wafers W in the cassettes C are mounted onto the wafer boat 123 by the wafer transfer means 125. When a set number (e.g., 100 sheets) of the wafers W have been mounted on the wafer boat 123, the wafer boat 123 is lifted by the lift means 124 to be loaded into the heat treatment vessel 122. The heat treatment is conducted there on the wafers W.

On the other hand, during the above-described operation, the circulating air flows X are formed by the first blowing means 141 in the casing 126. As shown in FIG. 14, this cleaned air flows are blown to the wafer boat 123. Accordingly even if particles should be generated when the wafers W are mounted on the wafer boat 123, they do not attach to the surface of the wafers W. There is therefore no risk that the particles may stay on the surfaces of the wafers W by flowing in the direction of the air flow. In addition, the circulating air flows X have been cleaned by the active carbon filters 147, 148 in the bottom duct 146, and the first filter unit 141, and the wafers W are free from the risk of contamination by exposure to the circulating air flows X.

That is, even if inorganic impurities are floating in the casing 126, these organic impurities are adsorbed and removed by the active carbon filters 147, 148 when passing through the bottom duct 146. The air which had the organic impurities thus removed is further cleaned by the first filter unit 141. Thus the circulating air flows have very high cleanness.

Because of the above-described active carbon filter 171, desired clean environments can be established in the heat treatment apparatus independently of gases and organic impurities present in environments about the site of the apparatus.

Furthermore, the first filter unit 141 is made of an unwoven fabric of PTFE or an olefin-based fiber as the filter material, whose effect was confirmed in the above described embodiment. Even in environments where radiant heat from the heat treatment vessel 122 is present, the filter material is very stable, and does not generate organic impurities, such as hydrocarbon.

Furthermore, the air flows have organic impurities removed by the active carbon filters 147, 148, and can stably function for a very long period of time.

The air flows Y and the descending air flows Z formed by the second blowing means 151 and the third blowing means 161 are cleaned by the active carbon filter and the filter material of an unwoven fabric of PTFE or an olefin-based fiber, and can achieve the same effect as the circulating air flows X.

Thus, the risk that the wafers W in the casing 126 may be contaminated by organic impurities and particles is much reduced, with a result of improvement of yields.

As apparent from the above-described embodiments, the filter unit used in the present invention does not basically differ from the conventional filter unit in appearance and constitution. Accordingly the filter unit of the present invention is readily applicable to heat treatment apparatuses in use by replacing their filter unit with the filter unit of the present invention or adding the active carbon filters. Thus the filter unit of the present invention is very practical.

What is claimed is:

1. A heat treatment apparatus wherein objects to be treated are loaded into a reaction tube from a transfer chamber for a heat treatment on an objects-to-be-treated holder, and unloaded after the treatment, comprising a circulation gas passage which has an inlet opening that opens into the transfer chamber, and said apparatus including a dust removing filter unit through which the circulated gas passes, and gas in the transfer chamber is circulated through the circulation gas passage, the apparatus further comprising:

a clean gas source, a supply passage for supplying clean gas from the clean gas source into the transfer chamber without passing the clean gas through the dust removing filter unit:

a supply passage opening/closing valve provided in the supply passage;

a control unit assembly for selecting a first ventilation mode or a second ventilation mode in the apparatus, the first ventilation mode being for stopping ventilation through the circulation gas passage with the supply passage opening/closing valve opened, and the second ventilation mode being for ventilation through the circulation gas passage with the supply passage opening/closing valve closed.

2. The heat treatment apparatus according to claim 1, wherein the supply passage comprises a plurality of gas feed pipes arranged horizontal along a width of the dust removing filter units, and a number of gas blowout holes are formed lengthwise in the gas feed pipes.

3. The heat treatment apparatus according to claim 1, wherein said filter unit is positioned at the inlet opening and said apparatus further comprising a second filter unit in line with said circulation gas passage.

4. The heat treatment apparatus according to claim 1, wherein said transfer chamber includes an outlet opening that opens out of said transfer chamber opposite of said inlet opening such that the holder is positioned between the inlet and outlet openings and the circulated gas flows across the holder when the holder is in the transfer chamber.

5. The heat treatment apparatus according to claim 1, wherein said transfer chamber includes a plate with a plurality of fine holes which together define outlet opening, and said circulating gas passage includes a first side section extending from said outlet opening to a section extending below said transfer chamber.

6. The heat treatment apparatus as recited in claim 1 further comprising an exhaust duct which opens into said circulation gas passage, a first fan and a shutter positioned between said inlet opening and an upstream end of a section of said circulation gas passage extending below said transfer chamber, and a second fan positioned within said exhaust duct, and said shutter including an opening/closing mechanism, and said control unit assembly having a control unit which, in addition to said supply passage opening/closing valve, is in communication with said first and second fans and the opening/closing mechanism of said shutter.

7. The heat treatment apparatus as recited in claim 1 wherein the clean gas source includes a supply of clean air.

8. The heat treatment apparatus as recited in claim 1 further comprising an outlet opening and said inlet and outlet openings being positioned on opposite side of the holder when positioned in said transfer chamber.

9. A heat treatment apparatus wherein objects to be treated are loaded into a reaction tube from a transfer chamber for a heat treatment on an objects-to-be-treated holder, and unloaded after the treatment, comprising a circulation gas passage with an inlet opening that opens in the transfer chamber and a dust removing filter unit, and gas in the transfer chamber is circulated through the circulation gas passage so as to pass through the filter unit when the heat treatment apparatus is in a gas circulation mode, the apparatus further comprising:

a control unit assembly which includes a control unit that initiates a stoppage of ventilation through the circulation gas passage at a time of unloading of treated objects out of the reaction tube.

10. The heat treatment apparatus as recited in claim 9 wherein said control unit also precludes ventilation of gas through the circulating gas passage and filter unit at a time when objects from the object-to-be treated holder are being dismounted, said control unit initiating ventilation of gas through the circulation gas passage and filter unit at a time when said holder is in said transfer chamber awaiting to receive the heat treatment.

11. A heat treatment apparatus wherein objects to be treated are loaded into a reaction tube from a transfer chamber for a heat treatment on an objects-to-be-treated holder, and unloaded after the treatment, said transfer chamber having an inlet opening and an outlet opening formed therein which are positioned such that a gas flowing within the transfer chamber between the inlet and outlet openings flows across the holder when positioned within said transfer chamber, said apparatus further comprising:

a circulation gas passage in communication with said inlet and outlet openings formed in said transfer chamber;

a filter unit positioned at the inlet opening of said transfer chamber;

a first blower for blowing gas within said circulation gas passage through the filter, across the holder, when positioned in said transfer chamber, out through said outlet opening and then back through the filter;

an exhaust duct in communication with said circulation gas passage;

a second blower positioned for directing gas out through said exhaust duct;

a clean gas supply assembly which includes a supply passage that has a feed pipe, said feed pipe being positioned within said transfer chamber at a location between said filter and the holder when positioned in said transfer chamber such that clean gas can be supplied to the holder without passing through said filter unit;

a shutter positioned within said circulation gas passage;
an opening/closing valve in said supply passage;
a control unit in communication with said opening/closing valve, each of said blowers, and said shutter, for alternating said apparatus between a first and a second gas circulation mode wherein, in the first mode, said shutter is closed, said first fan is off, said second fan is on and said opening/closing valve is open, and wherein, in the second mode said shutter is open, said first fan is on, said second fan is off and said opening/closing valve is closed.

* * * * *